(12) United States Patent
Ke

(10) Patent No.: US 10,340,904 B2
(45) Date of Patent: Jul. 2, 2019

(54) METHOD AND APPARATUS FOR PHASE-ALIGNED 2X FREQUENCY CLOCK GENERATION

(71) Applicant: ALTERA CORPORATION, San Jose, CA (US)

(72) Inventor: Yanjing Ke, Union City, CA (US)

(73) Assignee: Altera Corporation, San Jose, CA (US)

( * ) Notice: Subject to any disclaimer, the term of this patent is extended or adjusted under 35 U.S.C. 154(b) by 215 days.

(21) Appl. No.: 15/195,745

(22) Filed: Jun. 28, 2016

(65) Prior Publication Data

US 2017/0373675 A1    Dec. 28, 2017

(51) Int. Cl.
| | |
|---|---|
| H03K 3/00 | (2006.01) |
| H03K 5/15 | (2006.01) |
| H03K 5/156 | (2006.01) |
| H03K 19/20 | (2006.01) |
| H03M 9/00 | (2006.01) |
| H03K 19/173 | (2006.01) |
| H03K 19/177 | (2006.01) |

(52) U.S. Cl.
CPC ....... *H03K 5/15066* (2013.01); *H03K 5/1565* (2013.01); *H03K 19/1737* (2013.01); *H03K 19/17744* (2013.01); *H03K 19/20* (2013.01); *H03M 9/00* (2013.01)

(58) Field of Classification Search
CPC ............. H03K 5/15066; H03K 5/1565; H03K 19/1737; H03K 19/17744; H03K 19/20; H03M 9/00
USPC ........................................................ 327/293
See application file for complete search history.

(56) References Cited

U.S. PATENT DOCUMENTS

| | | | |
|---|---|---|---|
| 4,654,599 | A | 3/1987 | Zbinden et al. |
| 4,775,804 | A | 10/1988 | Marple |
| 4,989,223 | A | 1/1991 | Katayose |
| 5,220,585 | A | 6/1993 | Sasaki et al. |
| 5,256,994 | A | 10/1993 | Langendorf |
| 5,479,125 | A | 12/1995 | Tran |
| 5,726,651 | A | 3/1998 | Belot |

(Continued)

FOREIGN PATENT DOCUMENTS

EP    1 753 142 A2    2/2007

OTHER PUBLICATIONS

Extended European Search Report for Patent Application No. 17173305.8, dated Nov. 30, 2017, 12 pages.

*Primary Examiner* — Ryan Jager
(74) *Attorney, Agent, or Firm* — Compass IP Law PC

(57) ABSTRACT

One embodiment relates to a multiple-channel serializer circuit that includes a plurality of one-channel serializers. A one-channel serializer of the plurality of one-channel serializes includes a local 2× frequency clock generator with a non-divider structure. Other embodiments relate to methods of using a non-divider circuit to generate a local 2× frequency clock signal in a one-channel serializer of a multiple-channel serializer. Another embodiment relates to a local 2× frequency clock generator circuit with a non-divider structure. The local 2× frequency clock generator circuit includes a first circuit path which is selected by multiplexers for a first serialization ratio and may also include a second circuit path which is selected by the multiplexers for a second serialization ratio. Other embodiments and features are also disclosed.

13 Claims, 7 Drawing Sheets

(56) References Cited

U.S. PATENT DOCUMENTS

| | | | |
|---|---|---|---|
| 5,726,990 A * | 3/1998 | Shimada | H03M 9/00 |
| | | | 327/407 |
| 5,757,807 A | 5/1998 | Tezuka et al. | |
| 6,809,564 B2 | 10/2004 | Hill | |
| 7,015,838 B1 * | 3/2006 | Groen | H03M 9/00 |
| | | | 341/100 |
| 7,053,682 B2 | 5/2006 | Kuzmenka | |
| 7,106,227 B2 * | 9/2006 | Karlquist | H04J 3/047 |
| | | | 341/101 |
| 7,236,040 B2 | 6/2007 | Chan et al. | |
| 7,366,267 B1 * | 4/2008 | Lee | H03K 5/135 |
| | | | 341/100 |
| 7,551,016 B2 | 6/2009 | Bracamontes del Toro | |
| 7,848,318 B2 * | 12/2010 | Nguyen | H03K 19/17744 |
| | | | 341/100 |
| 7,912,882 B2 | 3/2011 | Kim | |
| 7,991,101 B2 | 8/2011 | Kocaman et al. | |
| 8,165,258 B2 | 4/2012 | Weng et al. | |
| 8,462,028 B2 * | 6/2013 | Kashiwakura | H03M 9/00 |
| | | | 341/100 |
| 8,624,761 B1 * | 1/2014 | Gong | H03M 9/00 |
| | | | 341/100 |
| 8,836,384 B1 * | 9/2014 | Oh | H03K 19/00346 |
| | | | 327/109 |
| 2003/0194018 A1 | 10/2003 | Chang | |
| 2009/0259781 A1 | 10/2009 | Padaparambil | |
| 2011/0090101 A1 * | 4/2011 | Venkata | H03L 7/089 |
| | | | 341/101 |
| 2011/0291703 A1 * | 12/2011 | Lee | H03M 9/00 |
| | | | 326/93 |
| 2013/0121383 A1 | 5/2013 | Sadowski | |
| 2017/0310412 A1 * | 10/2017 | Gupta | H04J 3/0682 |

\* cited by examiner

METHOD AND APPARATUS FOR PHASE-ALIGNED 2X FREQUENCY CLOCK GENERATION

BACKGROUND

Technical Field

The present disclosure relates generally to the electronic circuits and, more particularly, to clock generation circuits.

Description of the Background Art

High-speed data interfaces are used to communicate data between devices in a system. High-speed data interfaces have been developed at increasingly fast data rates and may support multi-channel data transfers.

SUMMARY

One embodiment relates to a multiple-channel serializer circuit that includes a plurality of one-channel serializers. A central clocks generator generates a plurality of clock signals, and a clock network distributes the plurality of clock signals from the central clocks generator. Each one-channel serializer includes a series of serializer circuits that uses the plurality of clock signals from the clock network to serialize a parallel data input signal. A one-channel serializer of the plurality of one-channel serializers includes a local 2× frequency clock generator with a non-divider structure.

Other embodiments relate to methods of using a non-divider circuit to generate a local 2× frequency clock signal in a one-channel serializer of a multiple-channel serializer.

In one method, a first shift phase 1× frequency clock pulse signal is received from a central clocks generator at a first input of an OR gate, and a second shift phase 1× frequency clock pulse signal is received from the central clocks generator at a second input of the OR gate. An OR gate output signal is generated by performing a logical OR operation on the first and second inputs of the OR gate. The OR gate output signal is sampled using a rising edge of a first clock signal from the clock network to generate a local 2× frequency clock signal having a 50% duty cycle.

In another method, a first shift phase 1× frequency clock pulse signal is sampled using a falling edge of a first clock signal from a clock network so as to generate a first sampled clock signal. A first logical OR operation is performed on the first sampled clock signal and a second shift phase 1× frequency clock pulse signal from the clock network to generate a first OR gate output signal. The first OR gate output signal is sampled using a rising edge of a second clock signal from the clock network so as to generate a second sampled clock signal. The second sampled signal is re-sampled using a falling edge of the second clock signal so as to generate a third sampled clock signal. A second logical OR operation is performed on the second and third sampled clock signals to generate the local 2× frequency clock signal which has a 50% duty cycle.

Another embodiment relates to a local 2× frequency clock generator circuit with a non-divider structure. The local 2× frequency clock generator circuit includes a first circuit path which is selected by multiplexers for a first serialization ratio and may also include a second circuit path which is selected by the multiplexers for a second serialization ratio.

The first circuit path may include: a first OR gate that receives as input a first shift phase 1× frequency clock pulse signal and a second shift phase 1× frequency clock pulse signal from a clock network and generates a first OR gate output signal; and a first flip-flop sampling circuit that samples the first OR gate output signal using a rising edge of a first clock signal from the clock network and generates a first local 2× frequency clock signal having a 50% duty cycle.

The second circuit path may include: a second flip-flop sampling circuit that samples a third shift phase 1× frequency clock pulse signal using a falling edge of a second clock signal from the clock network and outputs a second sampled clock signal; a second OR gate that receives as input the second sampled clock signal and the second shift phase 1× frequency clock pulse signal from the clock network and generates a second OR gate output signal; the first flip-flop sampling circuit that samples the second OR gate output signal using a rising edge of a fourth clock signal from the clock network and outputs a third sampled clock signal; a third flip-flop sampling circuit that samples the third sampled signal using a falling edge of the fourth clock signal and outputs a fourth sampled clock signal; and a third OR gate that receives as input the third and fourth sampled clock signals and generates a second local 2× frequency clock signal having a 50% duty cycle.

Other embodiments and features are also disclosed.

DETAILED DESCRIPTION

High-speed data interfaces may provide for multi-channel phase-aligned data transfers. Such data transfers may require a phase-aligned 2× frequency clock signal. The phase-aligned 2× frequency clock signal may be used, for example, to support double data rate transfers.

The present disclosure provides local 2× frequency clock generation in a serializer circuit. The local 2× frequency clock signal has a frequency which is twice that of a 1× frequency clock signal, wherein the 1× frequency clock signal is used for timing the serial data signal which is output by the serializer circuit.

Advantageously, the method and apparatus disclosed herein provides multiple-channel phase alignment in a reliable manner due to its aligned clock source. The frequency of the disclosed solution is programmable with the system serialization ratio. In addition, the 50% duty cycle of the 2× frequency clock signal is ensured by a high-frequency clock re-sample.

Figure 1:
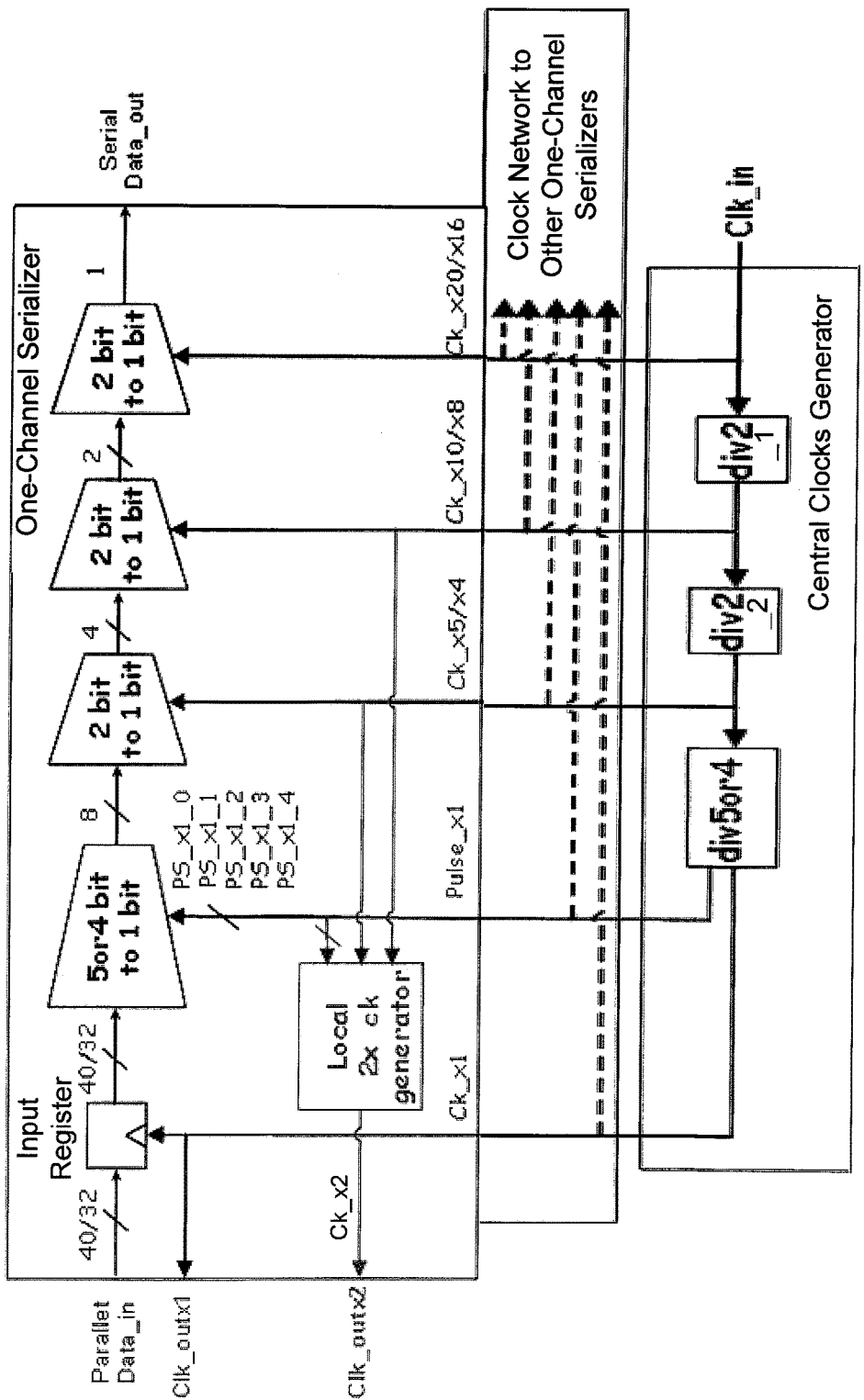
FIG. 1 depicts a multiple-channel serializer with a central clocks generator and local 2× frequency clock generators in accordance with an embodiment of the invention.

FIG. 1 depicts a multiple-channel serializer with a central clocks generator and local 2× frequency clock generators in accordance with an embodiment of the invention. As indicated in FIG. 1, the multiple-channel serializer includes a plurality of one-channel serializers, and each one-channel serializer includes a local 2× frequency clock generator with a non-divider structure. While the structure of a single one-channel serializer is shown, the multiple-channel serializer includes other one-channel serializers with the same structure.

Each one-channel data serializer serializes a parallel data input to generate a serial data output. In the exemplary implementation shown, the parallel data input may be configurable to either a 40-bit width or a 32-bit width, corresponding to 40:1 and 32:1 serialization ratios, respectively. Note that the 40:1 serialization ratio is 5/4 times the 32:1 serialization ratio.

The implementation depicted in FIG. 1 with 40:1 and 32:1 serialization ratios may be modified so as to be configurable to a variety of serialization ratios. For example, an exemplary implementation may be configurable to serialization ratios of 80:1, 64:1, 40:1, 32:1, 20:1, and 16:1. Note that the 80:1 serialization ratio is 5/4 times the 64:1 serialization ratio, the 40:1 serialization ratio is 5/4 times the 32:1 serialization ratio, and the 20:1 serialization ratio is 5/4 times the 16:1 serialization ratio. Providing the serialization ratios of 80:1 and 64:1 requires an additional 2 bit to 1 bit serializer in each one-channel serializer and an additional divide by 2 circuit in the central clocks generator. Providing the serialization ratios of 20:1 and 16:1 requires bypassing one of the 2 bit to 1 bit serializers in each one-channel serializer and bypassing one of the divide by 2 circuits in the central clocks generator.

In the implementation shown in FIG. 1, the parallel data input is received by an input register that is clocked by a 1× frequency clock signal (Ck_x1). The parallel data is transferred to a 5 or 4 bit to 1 bit serializer.

The 5 or 4 bits to 1 bit serializer is timed by 5 or 4 phase shift 1× clock signals and serializes the 40-bit or 32-bit wide data input to generate a 8-bit wide output. If the input is 40-bits wide, then the 5 or 4 bits to 1 bit serializer operates as a 5 bit to 1 bit (5:1) serializer and receives 5 phase shift 1× clock signals (PS_x1_0, PS_x1_1, PS_x1_2, PS_x1_3, and PS_x1_4) from the central clocks generator. If the input is 32-bits wide, then the 5 or 4 bits to 1 bit serializer operates as a 4 bit to 1 bit (4:1) serializer and receives 4 phase shift 1× clock signals (PS_x1_0, PS_x1_1, PS_x1_2, and PS_x1_3) from the central clocks generator. The 8-bit wide output is provided to a first 2 bits to 1 bit serializer.

The first 2 bits to 1 bit (2:1) serializer is timed by a x5 or x4 frequency clock signal (Ck_x5 or Ck_x4) and serializes the 8-bit wide data input to generate a 4-bit wide output. If the 5 or 4 bits to 1 bit serializer operates as a 5 bit to 1 bit (5:1) serializer, then the first 2 bits to 1 bit serializer is timed by a x5 frequency clock signal from the central clocks generator. If the 5 or 4 bits to 1 bit serializer operates as a 4 bit to 1 bit (4:1) serializer, then the first 2 bits to 1 bit serializer is timed by a x4 frequency clock signal from the central clocks generator. The 4-bit wide output is provided to a second 2 bits to 1 bit serializer.

The second 2 bits to 1 bit (2:1) serializer is timed by a x10 or x8 frequency clock signal (Ck_x10 or Ck_x8) and serializes the 4-bit wide data input to generate a 2-bit wide output. If the 5 or 4 bits to 1 bit serializer operates as a 5 bit to 1 bit (5:1) serializer, then the second 2 bits to 1 bit serializer is timed by a x10 frequency clock signal from the central clocks generator. If the 5 or 4 bits to 1 bit serializer operates as a 4 bit to 1 bit (4:1) serializer, then the second 2 bits to 1 bit serializer is timed by a x8 frequency clock signal from the central clocks generator. The 2-bit wide output is provided to a third 2 bits to 1 bit serializer.

The third 2 bits to 1 bit (2:1) serializer is timed by a x20 or x16 frequency clock signal (Ck_x20 or Ck_x16) and serializes the 2-bit wide data input to generate a serial (1-bit wide) data output (Serial Data_out). If the 5 or 4 bits to 1 bit serializer operates as a 5 bit to 1 bit (5:1) serializer, then the third 2 bits to 1 bit serializer is timed by a x20 frequency clock signal from the central clocks generator. If the 5 or 4 bits to 1 bit serializer operates as a 4 bit to 1 bit (4:1) serializer, then the second 2 bits to 1 bit serializer is timed by a x16 frequency clock signal from the central clocks generator.

The central clocks generator receives an input clock signal (Clk_in) which may be received from a phase-locked loop circuit, for example. The input clock signal is provided via the clock network as the x20 or x16 frequency clock signal (Ck_x20/x16) to the third 2 bit to 1 bit serializer in each one-channel serializer in the multiple-channel serializer.

A first divide by two (div2_1) circuit in the central clocks generator receives the input clock signal and outputs a first divided clock signal to a second divide by two (div2_2) circuit. The first divided clock signal is provided via the clock network as the x10 or x8 frequency clock signal (Ck_x10/x8) to the second 2 bit to 1 bit serializer in each one-channel serializer.

The second divide by two (div2_2) circuit in the central clocks generator receives the first divided clock signal and outputs a second divided clock signal to a divide by five or four (div5or4) circuit. The second divided clock signal is provided via the clock network as the x5 or x4 frequency clock signal (Ck_x5/x4) to the first 2 bit to 1 bit serializer in each one-channel serializer.

The divide by five or four circuit in the central clocks generator receives the second divided clock signal and outputs a third divided clock signal as the 1× frequency clock signal (Ck_x1) to the input register in each one-channel serializer. The divide by five or four circuit also outputs five or four shift phase 1× frequency clock pulse signals (PS_x1_0, PS_x1_1, PS_x1_2, PS_x1_3, and PS_x1_4, or PS_x1_0, PS_x1_1, PS_x1_2, and PS_x1_3) via the clock network to the 5 or 4 bit to 1 bit serializer in each one-channel serializer.

In accordance with an embodiment of the invention, each one-channel serializer of the multiple-channel serializer includes a local 2× frequency clock generator (Local 2× ck generator) with a non-divider structure. The local 2× frequency clock generator uses existing multiple frequencies and multiple phases of the local serializer clocks to generate the 2× frequency clock by combination logic and sample flip-flop circuits, as shown in detail in the circuit diagram of FIG. 2 and the timing diagrams of FIGS. 3 and 4.

Figure 2:
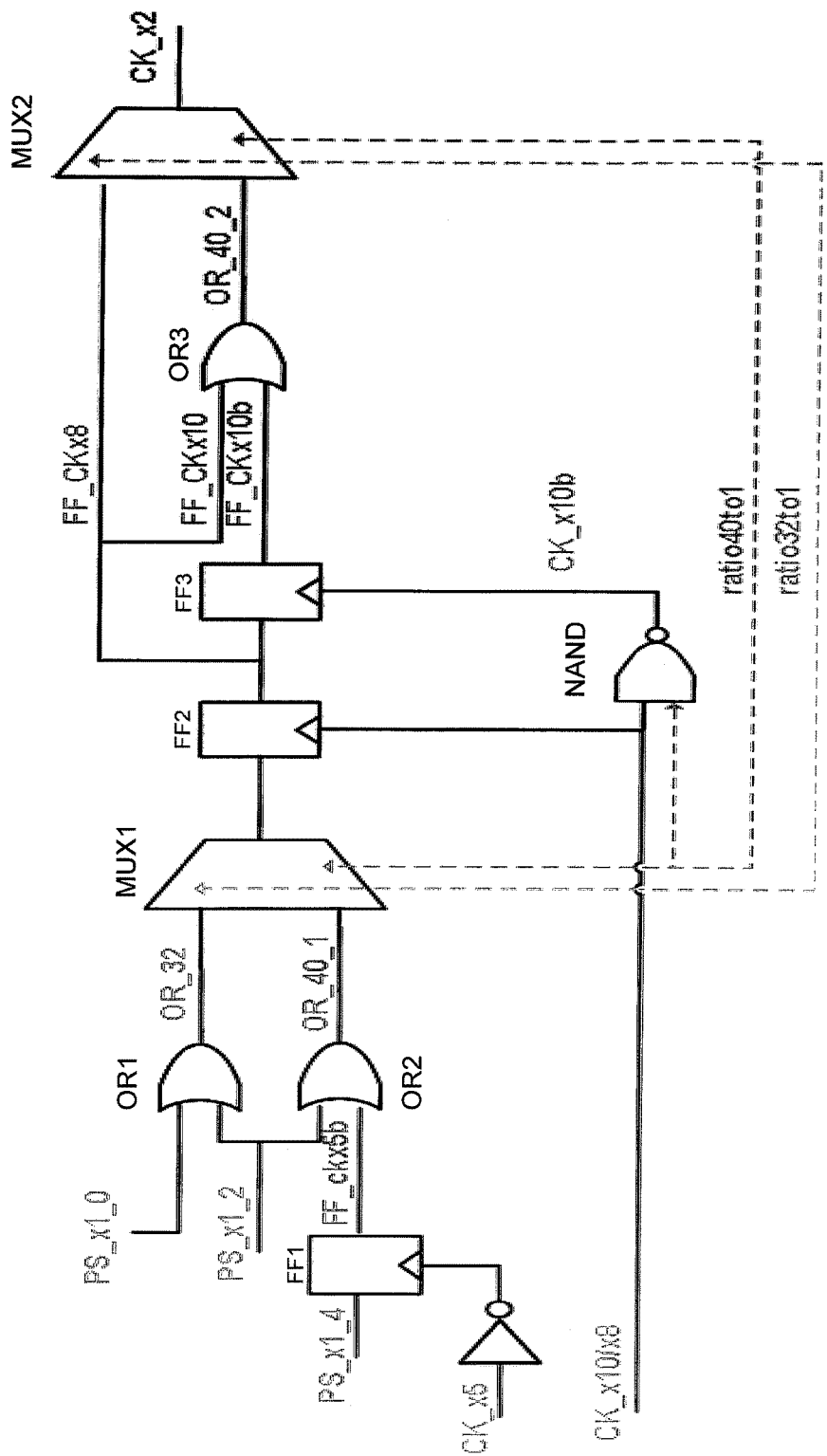
FIG. 2 is detailed circuit diagram of an exemplary implementation of a local 2× frequency clock generator with a non-divider structure in accordance with an embodiment of the invention.

FIG. 2 is detailed circuit diagram of an exemplary implementation of a local 2× frequency clock generator with a non-divider structure in accordance with an embodiment of the invention. The local 2× frequency clock generator depicted generates a frequency-programmable 50%-duty-cycle phase-aligned 2× frequency clock (Ck_x2).

32:1 Serialization Configuration

Figure 3:
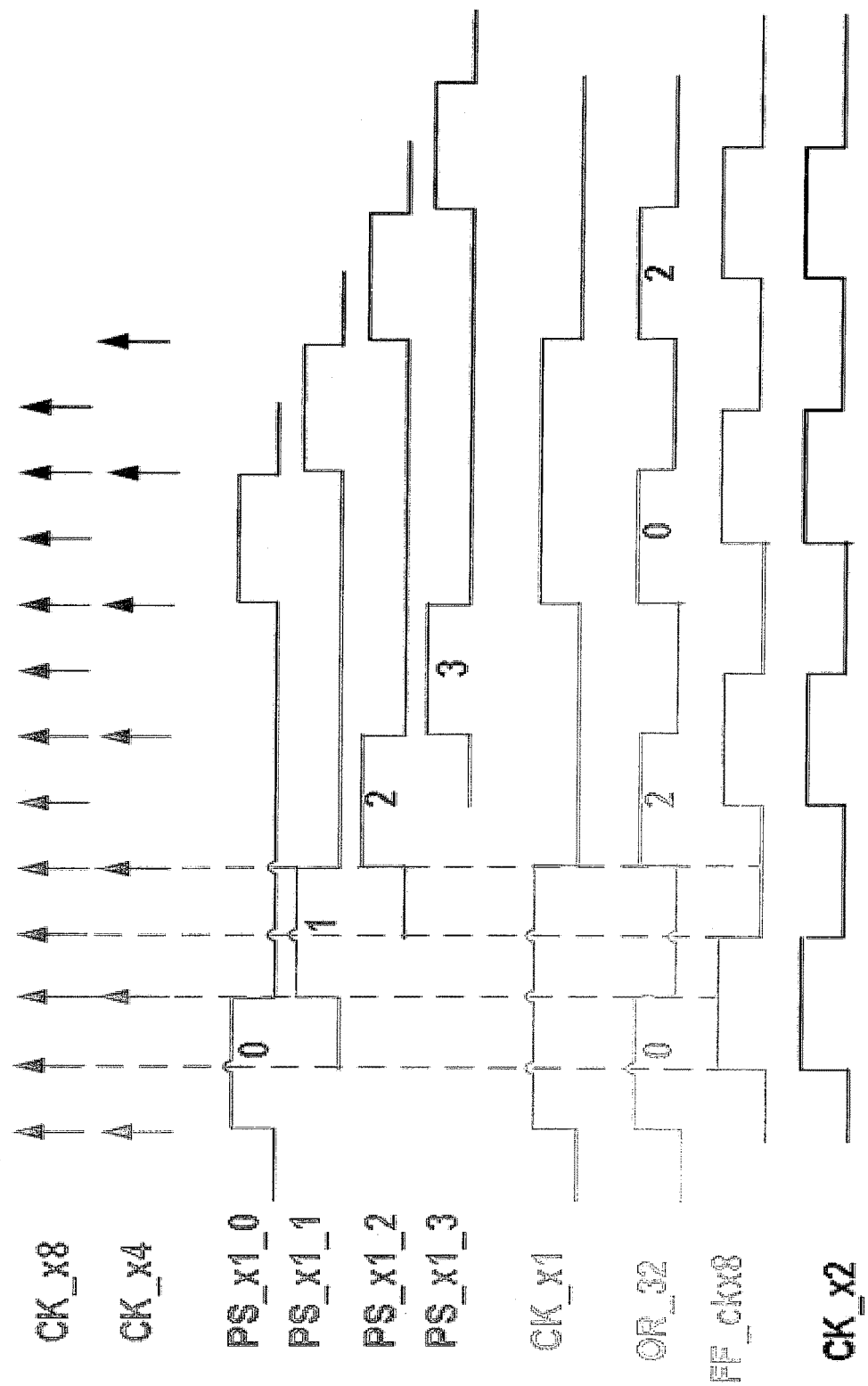
FIG. 3 is an exemplary timing diagram for the operation of a frequency-programmable 50%-duty-cycle phase-aligned local 2× generator at a 32-to-1 bit data serializer in accordance with an embodiment of the invention.

First, consider the 32:1 serialization configuration for the one-channel serializer. In this configuration, parallel data input to the one-channel serializer is 32 bits wide, and the one-channel serializer has four shift phase 1× frequency clock pulse signals (PS_x1_0/1/2/3). An exemplary timing diagram for this configuration is shown in FIG. 3. In FIG. 3, the Ck_x8, Ck_x4, PS_x1_0/1/2/3, and Ck_x1 signals are existing signals in the one-channel serializer, as described above in relation to FIG. 1.

In this 32:1 serialization configuration, the first multiplexer (MUX1) is controlled to select the output of the first OR (OR1) gate. The OR1 gate receives as inputs the 0 shift phase 1× frequency clock pulse signal (PS_x1_0) and the 2 shift phase 1× frequency clock pulse signal (PS_x1_2). The output of the OR1 gate is the OR_32 signal. The PS_x1_0, PS_x1_2, and OR_32 signals are depicted in the exemplary timing diagram in FIG. 3.

Hence, using two out of the four phase clock signals and the OR1 logic gate, a 2× frequency clock signal is formed as the OR_32 signal. However, the frequency and duty cycle quality of the OR_32 signal may not be reliable as they depend on the phase timing and the pulse widths of the phase clocks.

A 2× frequency clock signal with reliable (good quality) frequency and reliable (good quality) 50% duty cycle is formed from the OR_32 signal as follows. The flip-flop sampling circuit FF2 samples the OR_32 signal based on the rising edge of the 8× frequency clock (Ck_x8) so as to produce the FF_CKx8 signal, which is a local 2× frequency clock with reliable frequency and reliable 50% duty cycle. The second multiplexer (MUX2) is controlled to select the FF_CKx8 signal for output as the local 2× frequency clock.

40:1 Serialization Configuration

Figure 4:
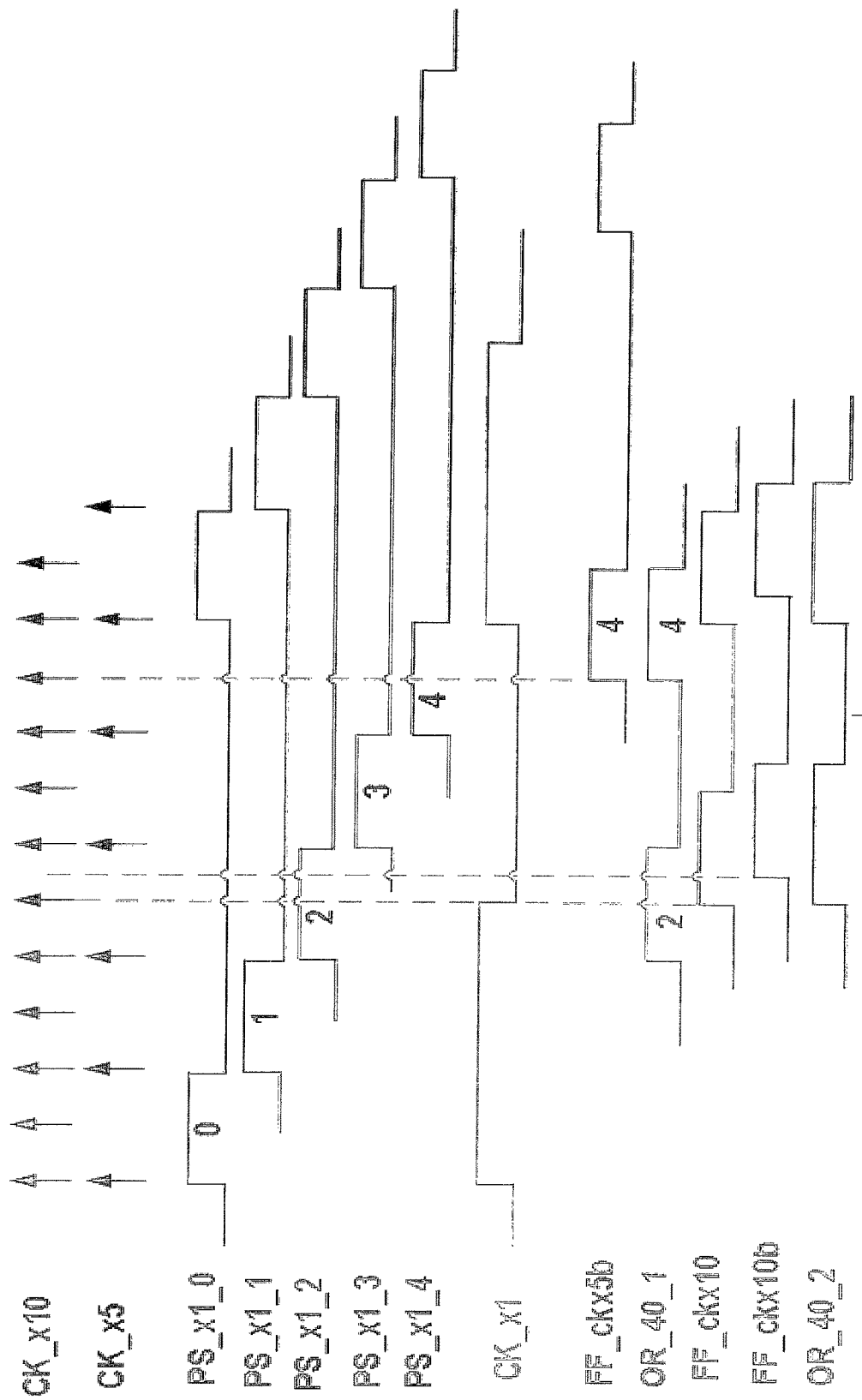
FIG. 4 is an exemplary timing diagram for the operation of a frequency-programmable 50%-duty-cycle phase-aligned local 2× generator at a 40-to-1 bit data serializer in accordance with an embodiment of the invention.

Second, consider the 40:1 serialization configuration for the one-channel serializer. In this configuration, parallel data input to the one-channel serializer is 40 bits wide, and the one-channel serializer has five shift phase 1× frequency clock pulse signals (PS_x1_0/1/2/3/4). An exemplary timing diagram for this configuration is shown in FIG. 4. In FIG. 4, the Ck_x10, Ck_x5, PS_x1_0/1/2/3/4, and Ck_x1 signals are existing signals in the one-channel serializer, as described above in relation to FIG. 1.

In this 40:1 serialization configuration, the flip-flop sampling circuit FF1 samples the 4 shift phase 1× frequency clock pulse signal (PS_x1_4) using the falling edge of the Ck_x5 signal to generate the FF_ckx5b signal. The OR2 gate receives as inputs the FF_ckx5b signal and the 2 shift phase 1× frequency clock pulse signal (PS_x1_2). The output of the OR2 gate is the OR_40_1 signal, and the first multiplexer (MUX1) is controlled to select the output of the second OR (OR2) gate, which is the OR_40_1 signal. The PS_x1_4, PS_x1_2, and OR_40 signals are depicted in the exemplary timing diagram in FIG. 4.

Hence, using two out of the four phase clock signals and the OR2 logic gate, a 2× frequency clock signal is formed as the OR_40_1 signal. However, the duty cycle of the OR_40_1 signal is 40% because of the 2 out of 5 phase ratio.

The flip-flop sampling circuit FF2 samples the OR_40_1 signal based on the rising edge of the 10× frequency clock (Ck_x10) so as to produce the FF_CKx10 signal. The flip-flop sampling circuit FF3 re-samples the FF_CKx10 signal based on the falling edge of the 10× frequency clock (Ck_x10) so as to produce the FF_CKx10b signal.

The third OR (OR3) gate receives as inputs the FF_CKx10 and FF_CKx10b signals and outputs the OR_40_2 signal, which is a reliable 50% duty cycle 2× frequency clock. The second multiplexer (MUX2) is controlled to select the OR_40_2 signal for output as the local 2× frequency clock. Note that the rising edge of the 10× frequency clock (Ck_x10) ensures frequency quality of the local 2× frequency clock signal, and that the duty cycle quality is provided by the duty cycle of the 10× frequency clock (Ck_x10), due to the falling edge resampling.

Note that the above-described local 2× frequency clock generator has a non-divider structure. This non-divider structure contrasts with the local 2× frequency clock generator shown in FIG. 5 which uses a divider circuit.

Figure 5:
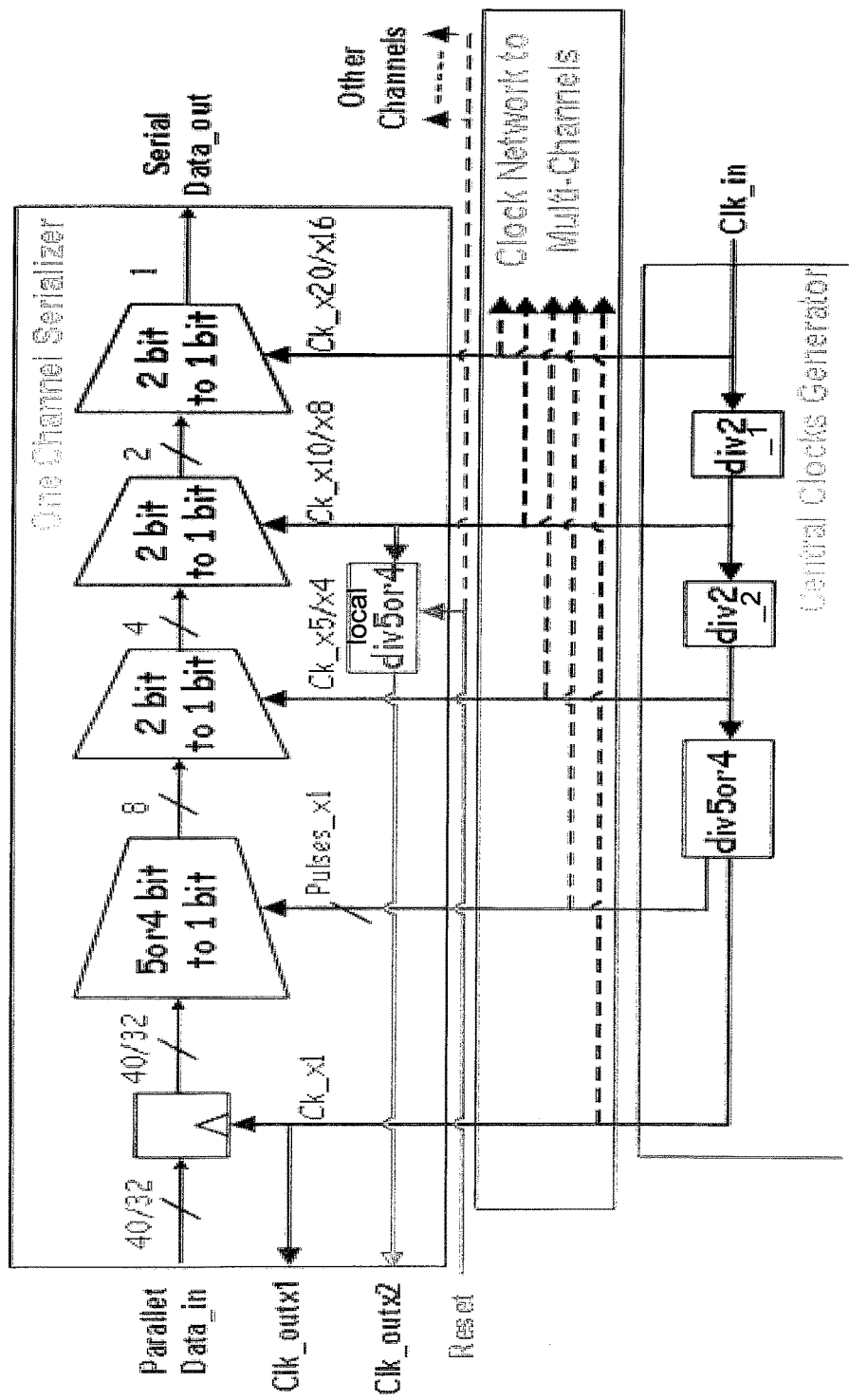
FIG. 5 depicts a multiple-channel serializer with a central clocks generator where each of multiple one-channel serializers includes a local 2× frequency clock generator with a divider structure.

As shown in FIG. 5, a local divide by 5 or 4 circuit may be used to generate a local 2× frequency clock signal within each one-channel serializer. For the 32:1 serialization ratio configuration, the local divide by 5 or 4 circuit is configured as a local divide by 4 circuit that receives the 8× frequency clock (Ck_x8) from the first divide by 2 (div2_1) circuit and outputs the 2× frequency clock (Clk_outx2). For the 40:1 serialization ratio configuration, the local divide by 5 or 4 circuit is configured as a local divide by 5 circuit that receives the 10× frequency clock (Ck_x10) from the first divide by 2 (div2_1) circuit and outputs the 2× frequency clock (Clk_outx2).

However, in order to phase align the 2× frequency clock in each channel with the 2× frequency clocks in the other channels, a well-balanced global reset signal (Reset) is required to be provided to the local divide by 5 or 4 circuit in each of the one-channel serializers in the multiple-channel serializer. Otherwise, the reset signal propagation delay difference between channels may cause the phase alignment of the local 2× frequency clocks to be incorrect. Unfortunately, designing a well-balanced global reset signal is non-trivial and may be problematic. In contrast, the presently-disclosed non-divider structure for a local 2× frequency clock generator does not require such a global reset signal.

Figure 6:
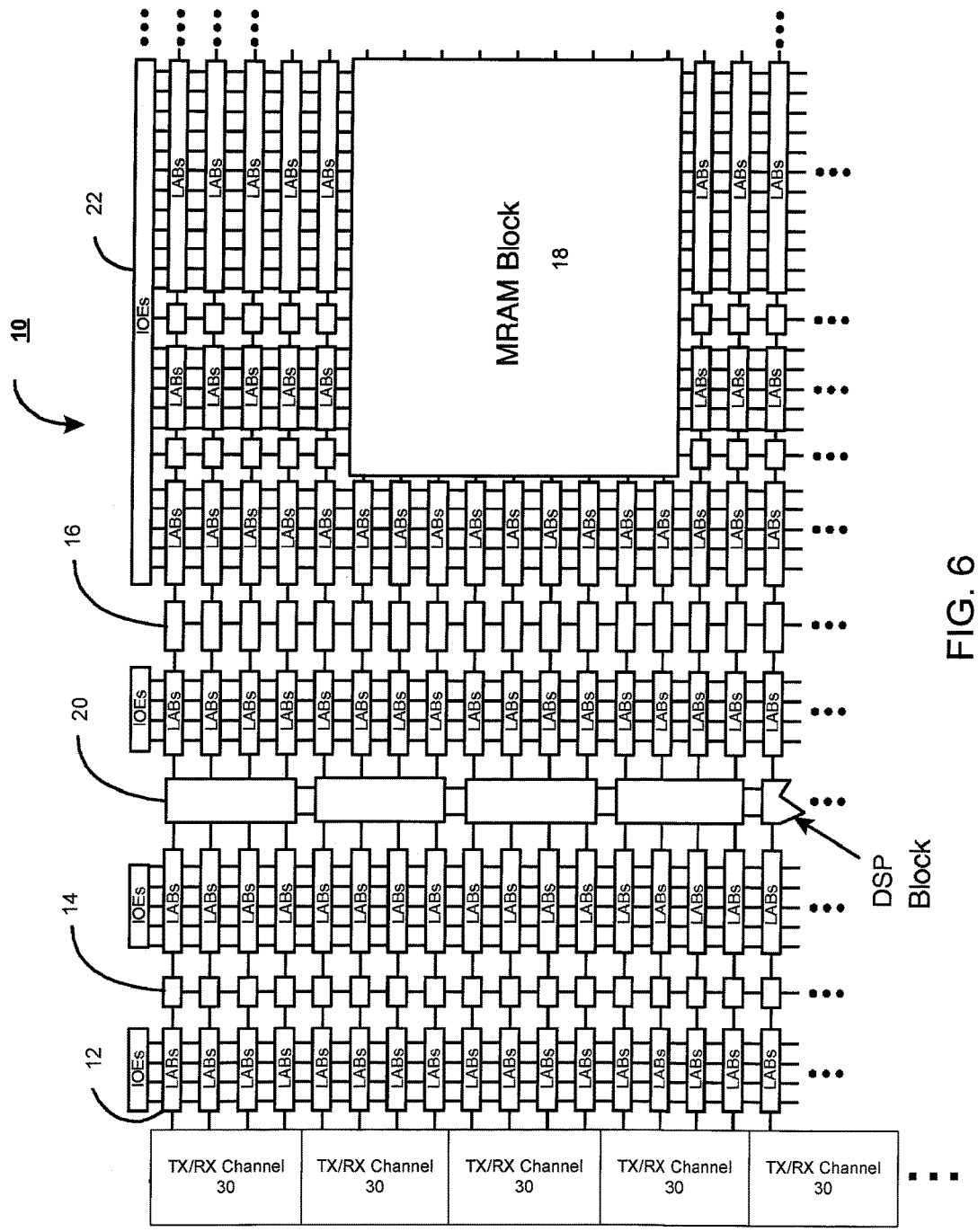
FIG. 6 is a simplified partial block diagram of a field programmable gate array (FPGA) that can include aspects of the present invention.

FIG. 6 is a simplified partial block diagram of a field programmable gate array (FPGA) 10 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. The TX/RX channel array may include, among other circuitry, the multiple-channel serializer with local 2× frequency clock generation as described herein.

It is to be understood that FPGA 10 is described herein for illustrative purposes only and that the present invention can be implemented in many different types of PLDs, FPGAs, and ASICs.

Figure 7:
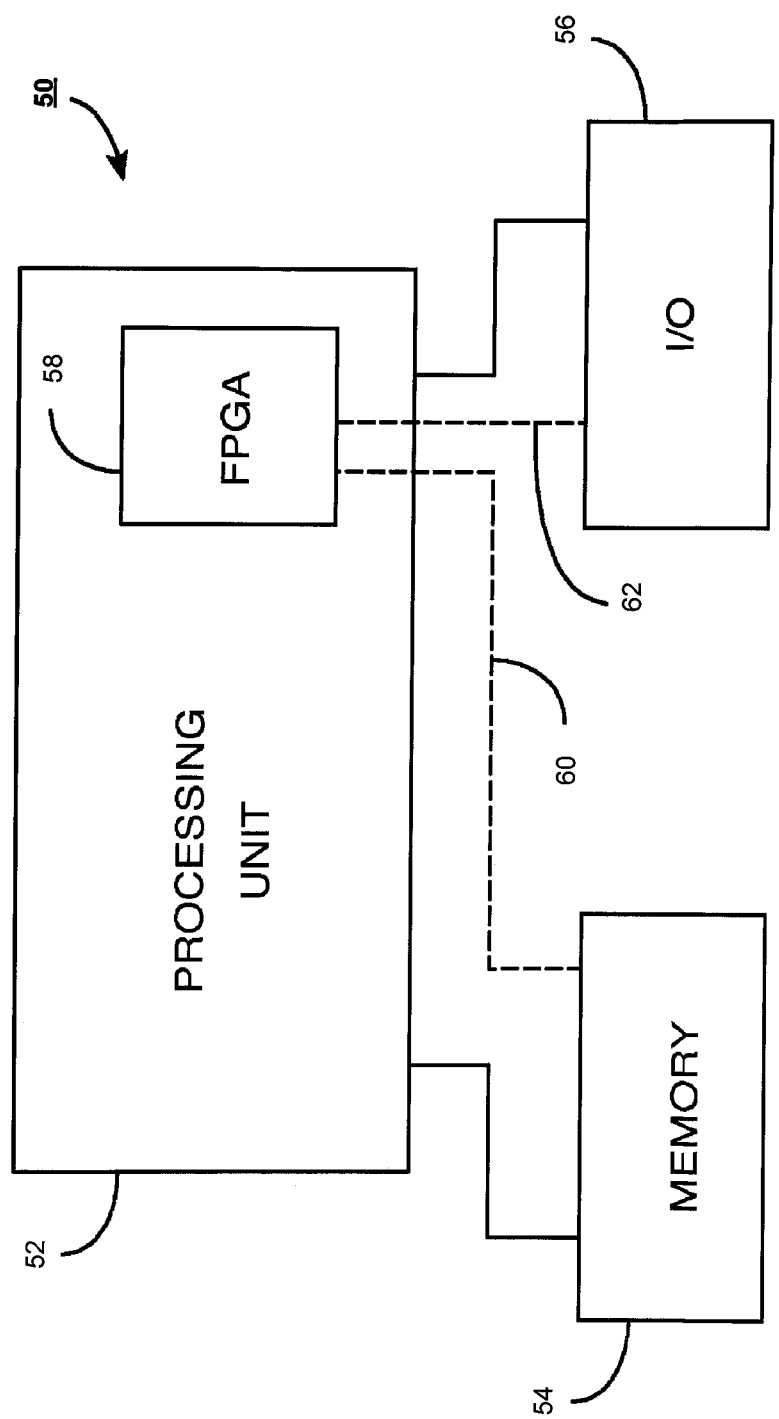
FIG. 7 is a block diagram of an exemplary digital system that can employ techniques of the present invention.

FIG. 7 shows a block diagram of an exemplary digital system 50 that can embody techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

CONCLUSION

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A multiple-channel serializer circuit comprising:
   a central clocks generator that generates a plurality of clock signals;
   a clock network for distributing the plurality of clock signals from the central clocks generator; and
   a plurality of one-channel serializers, each one-channel serializer comprising a series of serializer circuits that use the plurality of clock signals from the clock network to serialize a parallel data input signal,
   wherein a one-channel serializer of the plurality of one-channel serializes further comprises a local 2× frequency clock generator with a non-divider structure that generates a local 2× frequency clock signal that has a frequency which is twice that of a 1× frequency clock signal output from the central clocks generator, wherein the 1× frequency clock signal is used for timing a parallel data signal input to the one-channel serializer.

2. The circuit of claim 1, wherein the one-channel serializer is configurable for a plurality of serialization ratios.

3. The circuit of claim 2, wherein the plurality of serialization ratios comprise a first serialization ratio and a second serialization ratio, where the first serialization ratio is 5/4 times the second serialization ratio.

4. The circuit of claim 2, wherein the plurality of serialization ratios comprise a 40:1 serialization ratio and a 32:1 serialization ratio.

5. The circuit of claim 2, wherein the plurality of serialization ratios comprise 80:1, 64:1, 40:1, 32:1, 20:1, and 16:1 serialization ratios.

6. The circuit of claim 1, wherein the local 2× frequency clock generator with the non-divider structure comprises:
   an OR gate that receives as input a first shift phase 1× frequency clock pulse signal and a second shift phase 1× frequency clock pulse signal from the clock network and generates an OR gate output signal; and
   a flip-flop sampling circuit that samples the OR gate output signal using a rising edge of a first clock signal from the clock network and generates a local 2× frequency clock signal having a 50% duty cycle.

7. The circuit of claim 6, wherein both of the first and second shift phase 1× frequency clock pulse signals has a pulse width that is one fourth of a clock cycle of a 1× frequency clock signal.

8. The circuit of claim 7, wherein the second shift phase 1× frequency clock pulse signal is shifted in phase relative to the first shift phase 1× frequency clock pulse signal by one half of the clock cycle of a 1× frequency clock signal, and wherein the first clock signal is an 8× frequency clock signal.

9. The circuit of claim 1, wherein the local 2× frequency clock generator with the non-divider structure comprises:
   a first flip-flop sampling circuit that samples a first shift phase 1× frequency clock pulse signal using a falling edge of a first clock signal from the clock network and outputs a first sampled clock signal;
   a first OR gate that receives as input the first sampled clock signal and a second shift phase 1× frequency clock pulse signal from the clock network and generates a first OR gate output signal;
a second flip-flop sampling circuit that re-samples the first OR gate output signal using a rising edge of a second clock signal from the clock network and outputs a second sampled clock signal;
a third flip-flop sampling circuit that samples the second sampled signal using a falling edge of the second clock signal and outputs a third sampled clock signal; and
a second OR gate that receives as input the second and third sampled clock signals and generates a local 2× frequency clock signal having a 50% duty cycle.

10. The circuit of claim 9, wherein both of the first and second shift phase
1× frequency clock pulse signals has a pulse width that is one fifth of a clock cycle of a 1× frequency clock signal.

11. The circuit of claim 10, wherein the first shift phase 1× frequency clock pulse signal is shifted in phase relative to the second shift phase 1× frequency clock pulse signal by two-fifths of the clock cycle of a 1× frequency clock signal, and wherein the first clock signal is an 5× frequency clock signal, and the second clock signal is a 10× frequency clock signal.

12. The circuit of claim 1, wherein the local 2× frequency clock generator with the non-divider structure comprises:
a first circuit path which is selected by multiplexers for a first serialization ratio, the first circuit path comprising
a first OR gate that receives as input a first shift phase 1× frequency clock pulse signal and a second shift phase 1× frequency clock pulse signal from a clock network and generates a first OR gate output signal, and
a first flip-flop sampling circuit that samples the first OR gate output signal using a rising edge of a first clock signal from the clock network and generates a first local 2× frequency clock signal having a 50% duty cycle.

13. The circuit of claim 12 further comprising:
a second circuit path which is selected by the multiplexers for a second serialization ratio, the second circuit path comprising
a second flip-flop sampling circuit that samples a third shift phase 1× frequency clock pulse signal using a falling edge of a second clock signal from the clock network and outputs a second sampled clock signal,
a second OR gate that receives as input the second sampled clock signal and the second shift phase 1× frequency clock pulse signal from the clock network and generates a second OR gate output signal,
the first flip-flop sampling circuit that samples the second OR gate output signal using a rising edge of a fourth clock signal from the clock network and outputs a third sampled clock signal,
a third flip-flop sampling circuit that samples the third sampled signal using a falling edge of the fourth clock signal and outputs a fourth sampled clock signal, and
a third OR gate that receives as input the third and fourth sampled clock signals and generates a second local 2× frequency clock signal having a 50% duty cycle.

\* \* \* \* \*